(12) United States Patent
Schmidt et al.

(10) Patent No.: US 12,494,785 B2
(45) Date of Patent: Dec. 9, 2025

(54) DEVICE FOR READING AND DECODING QUANTUM INFORMATION

(71) Applicant: COMMISSARIAT A L'ENERGIE ATOMIQUE ET AUX ENERGIES ALTERNATIVES, Paris (FR)

(72) Inventors: Quentin Schmidt, Grenoble (FR); Franck Badets, Grenoble (FR); Yvain Thonnart, Grenoble (FR); Baptiste Jadot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/747,062

(22) Filed: Jun. 18, 2024

(65) Prior Publication Data
US 2024/0429919 A1    Dec. 26, 2024

(30) Foreign Application Priority Data

Jun. 22, 2023  (FR) ........................................ 2306530

(51) Int. Cl.
*H03K 17/92* (2006.01)
(52) U.S. Cl.
CPC ................................... *H03K 17/92* (2013.01)
(58) Field of Classification Search
CPC ........................................................ H03K 17/92
USPC ........................................................ 327/527
See application file for complete search history.

(56) References Cited

U.S. PATENT DOCUMENTS

2022/0140927 A1* 5/2022 Bronn .................... H10N 69/00
                                                                    370/480
2022/0188687 A1   6/2022 Morel et al.

FOREIGN PATENT DOCUMENTS

| EP | 2 075 745 A1 | 7/2009 |
| EP | 4 016 402 A1 | 6/2022 |
| WO | 2018/185542 A1 | 10/2018 |
| WO | 2021/061776 A1 | 4/2021 |

OTHER PUBLICATIONS

Park, et al., "A fully integrated cryo-CMOS SoC for state manipulation, readout and high-speed gate pulsing of spin qubits", IEEE Journal of Solid State Circuits, vol. 56, No. 11, pp. 3289-3306, 2021.

(Continued)

*Primary Examiner* — Tomi Skibinski
(74) *Attorney, Agent, or Firm* — BakerHostetler

(57) ABSTRACT

A quantum device comprising a plurality of qubits, a demultiplexing circuit, a common transmission line for transmitting qubit read signals to the demultiplexing circuit, and, for each qubit of the plurality, one quantum electrometer coupled to the qubit with a view to transmitting, over the common transmission line, a signal depending on a current state of the qubit and on a periodic excitation applied to the quantum electrometer. The quantum device is noteworthy in that, the periodic excitations transmitted to a group of qubits of the device being transmitted with an identical frequency, the device comprises phase-shifting means that introduce distinct phase shifts and optionally amplitude-attenuating means that introduce amplitude differences into the excitations respectively applied to the various quantum electrometers.

14 Claims, 10 Drawing Sheets

(56) References Cited

OTHER PUBLICATIONS

Jerger, et al., "Frequency division multiplexing readout and simultaneous manipulation of an array of flux qubits", arXiv:1205.6375v2, Appl. Phys. Lett. 101, 042604, 2012.
Gong, et al., "Design Considerations for Spin Readout Amplifiers in Monolithically Integrated Semiconductor Quantum Processors", 2019 IEEE Radio Frequency Integrated Circuits Symposium, 2019.
Razavi, "A 622 Mb/s 4.5 pA/VHz CMOS transimpedance amplifier", 2000 IEEE International Solid-State Circuits Conference. Digest of Technical Papers (Cat. No. 00CH37056), 2000. Modern CMOS Transimpedance Amplifiers for OTDR Applications, Electronics.
Romanova, et al., "A Review of Modern CMOS Transimpedance Amplifiers for OTDR Applications", Electronics 2019, vol. 8, 1073, 2019.

* cited by examiner

DEVICE FOR READING AND DECODING QUANTUM INFORMATION

CROSS-REFERENCE TO RELATED APPLICATION

This application claims priority to foreign French patent application No. FR 2306530, filed on Jun. 22, 2023, the disclosure of which is incorporated by reference in its entirety.

FIELD OF THE INVENTION

The invention relates to reading and decoding quantum information, in the context of implementation of electronic or computer circuits based on quantum bits, or qubits.

BACKGROUND

Quantum computing is a technical field that is under development. It is based on the use of a quantum state with two measurable levels as a data vector called a quantum bit or, more commonly, a qubit.

Various technologies of implementation exist, one thereof being superconducting qubits (which are in particular based on use of Josephson junctions) such as charge qubits and transmons in particular.

Moreover, the technology of spin qubits is known. These consist of an electron or electron hole (commonly called a hole) of spin ½ and the two possible spin orientations of which define the measurable levels of the information. Spin qubits may be formed in semiconductors such as silicon, which have a high integration potential. Electrons or holes are individually confined in quantum wells that are kept at cryogenic temperatures in a cryostat and that are formed within electrostatically defined nano-sized confinement structures called quantum dots.

Reading spin qubits, just like reading qubits in other technologies, is beset by many challenges. Mainly because of the operating temperature of the qubits, which is generally less than 1 K, the environment close to the qubits is unfavourable to electronic read circuits. In addition, it is necessary to read the qubits in large numbers, this imposing constraints in terms of power consumption and size. It is also necessary to combat electromagnetic noise and to minimize read times given the coherence time of the qubits.

Various solutions have been proposed. It has been proposed to place electronic read circuits right by the qubits and therefore at low temperature, or conversely in an environment that is more remote and therefore less cold.

It has also been proposed to use read techniques employing reflectometry (the qubit is reached using a single cable—excitation and read-out being achieved using this single cable) or employing electrometry (namely read techniques that use an electrometer, i.e. an electronic component allowing a read to be obtained by measuring charge). Here, the electrometers of interest may be qualified quantum electrometers, because they interact with the qubit via quantum dots. Such electrometers have a charge sensitivity that is adjusted via one (or more than one) pole, called the gate, and two read poles called the source and drain, allowing a current (or a voltage) to be created through a variation in conductance as a function of the charge in the quantum dot.

With read methods employing reflectometry, which are based on transmission of a wave of up to a few GHz to the qubits (superconducting qubits or spin qubits), and on observation of the reflected wave, it is in general necessary to run from the cryostat a number of connection wires (cables) equal to the number of qubits to be read, this becoming very difficult if the number of qubits is large.

Alternatively, it has been proposed to send a plurality of signals at various frequencies via the same connection wire (cable), according to the principle of frequency-division multiplexing, and to handle these frequencies differently in the cryostat by virtue of suitable LC resonators placed within it, and coupled to each qubit. In the latter solution, it is necessary for the resonant frequency of the LC resonator associated with each qubit to be slightly different for each resonator, this being demanding in terms of hardware and read time, and therefore currently forming an obstacle to technological progress. In order to generate these signals closely spaced in frequency, it is known to synthesize a low-frequency comb with an analogue generator, then to multiply it by a carrier of higher frequency. The reflected signal is then demodulated by this carrier, then digitized with a view to extracting the signal associated with each qubit. The number of qubits that may thus be examined is inevitably limited by the bandwidth of the analogue generator and of the analogue-to-digital converter.

Read methods employing reflectometry are known from Park, 2021, Jerger 2012, Abdo 2018, Naaman, 2021 and Bronn, 2022.

The method based on reading charge (and therefore on electrometry), in the context of spin qubits, for its part consists firstly in promoting a spin-to-charge conversion and then subsequently in measuring an output current generated by capacitive electrostatic coupling, to the quantum dot of the spin qubit, of a quantum electrometer (i.e. an apparatus measuring electric charge, and comprising a quantum contact or quantum dot that, for the purposes of the measurement, is coupled to the quantum dot of an object to be measured, in the present case a qubit). The spin of the qubit is thus converted into information in the form of a current. A single-electron transistor (SET) or a quantum point contact (QPC) is used, these being non-limiting examples of quantum electrometers. The current (a few nanoamps at the output of a SET) is detected using a current-voltage amplifier, such as a transimpedance amplifier (TIA). These amplifiers may be placed at room temperature (300K), or at temperatures close to 4K or below 1K, with compromises in terms of power consumption and bandwidth.

Read methods employing electrometry are known from Williams, 2009, Gong, 2019 and Morel, 2022. Other electrometry-based read techniques, which instead of being based on a measurement of current are based on a measurement of voltage, have been envisaged.

Frequency-division multiplexing may be used to increase the number of qubits reachable in the read operation. This strategy distributes the qubits over the bandwidth of the read system, each qubit being assigned a different frequency.

This may be done through use of hardware resonators coupled to the qubits, defining different frequencies in the case of use of reflectometry. Thus, from Jerger, 2012, a system comprising qubit-coupled hardware resonators defining different frequencies is known, this being one way of decreasing the number of cables in the cryostat with respect to the number of qubits, in a read system employing reflectometry. The demodulation method is, in view of the available bandwidth, configured to double the number of qubits read compared to previous techniques, by using an in-phase integration channel and a quadrature integration channel (IQ components), and by addressing the high and low bands of the spectrum individually. However, the improvement obtainable in this way is limited to a factor of 2, and in addition it is necessary to double the number of demodulation chains or to double the read time, whereas it would be desirable to obtain greater simplification with a view to reading very many qubits.

Frequency-division multiplexing may also be achieved by exciting the pairs consisting of the electrometers and the associated qubits with distinct circuits, this being advantageous because it allows the frequencies to be changed without changing the hardware. Morel, 2022 thus proposes to use a plurality of oscillators as circuits for applying the excitation signals, and to demultiplex signals with a single integrator per frequency. The system of Morel, 2022, unlike that of Jerger, 2012, allows the frequencies to be changed insofar as they are not dictated by the physical components, and it avoids crosstalk between the excitations, by providing separate lines for the various frequencies.

No approach is yet known that allows more than 100 qubits to be read with electronic circuits placed in a cryostat, in particular because of the power consumption of the system. However, error-correcting codes require several tens, or even hundreds, of qubits in order to produce a single "perfect" logical qubit. This therefore means that it will be necessary to be able to read several thousand qubits, or even more, to produce high-performance quantum computers.

SUMMARY OF THE INVENTION

In this context, and to solve the aforementioned problems, what is provided, according to certain known principles, is a quantum device comprising a plurality of qubits, in a low-temperature vessel of the cryostat, and, for each qubit of the plurality of qubits, one electrometer coupled to said qubit and subjected, via its gate or via its drain, to a periodic excitation with a view to transmitting said excitation to the charge-measuring quantum dot associated with the qubit, this making it possible to extract a read signal allowing a current state of the qubit to be read, the read signals of the qubits of the plurality being summed on a common read line of the quantum device, then transmitted to a demultiplexing circuit of the quantum device outside said low-temperature vessel.

Thus, the underlying principles may result in the charge being read through a current (the quantum electrometer then has a conductance that varies as a function of the state of the qubit associated therewith and it may be a SET, or a QPC, in particular) or through a voltage if the electrometer delivers a voltage by way of output signal.

The quantum device is however noteworthy because, the periodic excitations transmitted to a group of a plurality of electrometers of the device being transmitted with an identical frequency using a synchronized generating means of the quantum device outside said low-temperature vessel, the quantum device comprises, in said low-temperature vessel, phase-shifting and optionally amplitude-attenuating means that introduce distinct phase shifts and optionally distinct amplitude attenuations into the excitations respectively applied to the electrometers of said group.

By virtue of these features, a plurality of qubits may be interrogated with a single frequency, this making it possible, with a given bandwidth, to multiply the number of qubits read simultaneously, while limiting the number of cables needing to be run from the cryostat. The footprint of the components required to demultiplex the signals is small, because only one demodulation chain is required per frequency, and therefore allows a plurality of qubits to be interrogated. Phase- and amplitude-division multiplexing may be used in parallel with frequency-division multiplexing, and complements it (phase- and amplitude-division multiplexing and frequency-division multiplexing are used simultaneously).

Thus, more than one qubit is read per frequency while the same excitation frequency is assigned to each qubit, but with a phase and optionally amplitude that differs in each case. The phase and amplitude of the output signal composed of the sum of the output currents $I_{out}$ of the transistors change depending on the state of each of the qubits excited at the frequency in question. Finally, this phase and amplitude information is extracted through use of IQ demodulation. The combinations of qubit states then take the form of a constellation of symbols that it is possible to interpret, in particular via digital decoding.

To avoid symmetries, it is possible to introduce a singularity of one form or another that allows symmetries to be suppressed and thus superposition of combinations of different states (or symbols) in the demodulated information to be avoided, and therefore it to be interpreted unambiguously.

Moreover, the architecture has the advantage of allowing flexibility in the choice of frequencies, the latter not being set by the hardware and being able to be modified from one use to another, without modifying the hardware.

Furthermore, according to the invention, only one cable need penetrate the temperature vessel of the cryostat (at least for one frequency), since the phase-shifting and amplitude-attenuating means are inside the temperature vessel, the voltage-generating means for their part conventionally being at a higher temperature, room temperature for example. The fact that only one cable penetrates the temperature vessel is noteworthy, because it facilitates installation of the circuit and improves its thermal budget. The synchronized generating means is a single generator, or a group of generators synchronized with one another.

Advantageously and Optionally the phase-shifting and optionally amplitude-attenuating means may be different cable lengths, adjustable phase shifters, injection-locked oscillators or chains of CMOS inverters.

the electrometers may be divided into a plurality of groups, each group receiving an excitation with a frequency different from those of the other groups, and the common read line is common to the electrometers of the various groups.

each electrometer may comprise a single-electron transistor, the qubits being spin qubits, the periodic excitation being applied to the gate of the transistor or more generally the gate of the electrometer and the transistor or more generally the electrometer and the associated qubit being coupled by capacitive coupling between their quantum dots. Thus, the spin of the qubit is converted into a charge then an output current generated by capacitive electrostatic coupling is measured. The spin of the qubit is thus converted into information in the form of a current.

the qubits may be spin qubits, and each pair consisting of a qubit and the associated electrometer is capacitively coupled via quantum dots belonging thereto.

The phases assigned to qubits may be assigned according to the following principles:

the phases associated with the electrometers of said group may be essentially regularly distributed every $2\pi/n$ radians, n being a prime natural number greater than or equal to 3, and the distribution of the associated symbols in the IQ plane is made irregular secondarily via a singularity in said distribution that disrupts its regularity without negating its existence.

For example, the number of electrometers in the group may be n−1, any one of the n values of the 2π/n radians being assigned to no electrometer of the group. The fact that one of the values is not assigned is the singularity in the distribution.

By way of another example, the signals corresponding to symbols containing a single value 1 (the phases associated with electrometers) may be distributed in the interval 0 to 2π radians according to a regular first-order (or first-instance) distribution comprising, however, in an order of lower magnitude (or second analysis), a phase shift suppressing the superposition between the combination of states, or symbol, containing only 0's and the combination of states, or symbol, containing only 1's—A particular implementation of this principle, which is merely one non-limiting example, is that the number of electrometers in the group may be n, the phases of a pair of two phases that are opposite with respect to each other with respect to TT radians being shifted towards each other with respect to the values that they would have had in the case of a strictly regular distribution of the phases. The shift in the values is the singularity in the distribution.

By way of yet another example, the number of electrometers in the group may be n, the amplitude of at least one of the excitations being decreased or increased with respect to at least one other. The amplitudes are multiplexed (varied for each of the qubits as required) in order to limit the symmetries of the selected phase distribution. This decrease or increase is a singularity such as mentioned above.

The presence of a singularity allows, as has already been said, symmetries to be suppressed and thus superposition of combinations of different states (or symbols) in the demodulated information to be avoided, and therefore it to be interpreted unambiguously.

Alternatively, the phases associated with the electrometers of said group may be essentially regularly distributed every π/n radians, n being a natural number greater than or equal to 4, and being the maximum number of qubits and of electrometers, and their distribution is made irregular secondarily if n is greater than or equal to 5.

Also alternatively, the amplitudes are assigned according to the following rule: from n=1, for odd n, the same amplitude is assigned to qubit n and to qubit n+1 and amplitudes are assigned to each successive odd number by dividing the previous amplitude by 2, the phases associated with the electrometers of said group being successively incremented by π/2 radians on passing from one qubit to the following qubit, or taking alternately two values shifted by π/2.

Other optional features will now be detailed:
said low-temperature vessel may be the temperature vessel of the qubits. It is then the temperature vessel of lowest temperature, and it is very advantageous for few cables to pass through it, given the implications in respect of energy.
said low-temperature vessel may be an intermediate-temperature vessel, the qubits being in a vessel of the cryostat that is a vessel that is at a lower temperature than said low-temperature vessel and that is internal thereto, and the phase-shifting and amplitude-attenuating means are outside the vessel that is at the lower temperature but in the intermediate-temperature vessel, which also encloses an amplifier for amplifying the signal on the common read line. Here it is a question of a cryostat with successive vessels of decreasing sizes, the coldest vessel being installed in the intermediate-temperature vessel.
the device is able to store, for example in a computer memory, a preliminary characterization of the response of the quantum device, recorded through said quadrature demodulating means, to the combinations of possible states of the qubits associated with the quantum electrometers of said group at said identical frequency and with said given distribution of the phase shifts, the discriminating means using said preliminary characterization. Using a preliminary characterization obtained before deployment and stored with a view to deployment of the quantum device allows the demodulated information to be interpreted and the combinations of states of the qubits read during operation of the device to be identified.

The discriminating means may be digital and achieve discrimination by region of interest or by searching for the nearest neighbour with a view to identifying combinations of states in the complex plane.

The quantum electrometer may be based on a single-electron transistor, but it may also be based on a quantum point contact, the qubits being spin qubits.

The quantum device may comprise, to transmit information out of a cryostat in which the qubits and quantum electrometers (typically SETs) are placed, to the demultiplexing circuit placed outside said cryostat, a single radiofrequency transmission line.

The quantum device may comprise, on the transmission line, an amplification chain with a bandwidth of 40 MHZ, the output signal-to-noise ratio of which is equal to 1.383 or more in order to ensure a read fidelity of 99.99%, the demodulation means have a read time of the order of 1 μs.

The quantum device may also comprise, on the transmission line, a transimpedance amplifier (TIA), for example a capacitive-network TIA, a shunt-feedback TIA, a regulated cascode TIA, or a push-pull TIA, which amplifies the read signals of the qubits of the group and optionally of other qubits, in particular the qubits of another group of qubits, the associated electrometers receiving another frequency, before their transmission in amplified form to the demultiplexing circuit.

The demultiplexing means may use quadrature demodulating means and then perform homodyne or heterodyne demodulation. They may also comprise a fast Fourier transform carried out after digitization of the read signal.

BRIEF DESCRIPTION OF THE DRAWINGS

The invention will be better understood and other advantages will become apparent on reading the following non-limiting description with reference to the appended figures, in which.

DETAILED DESCRIPTION

Figure 1A:
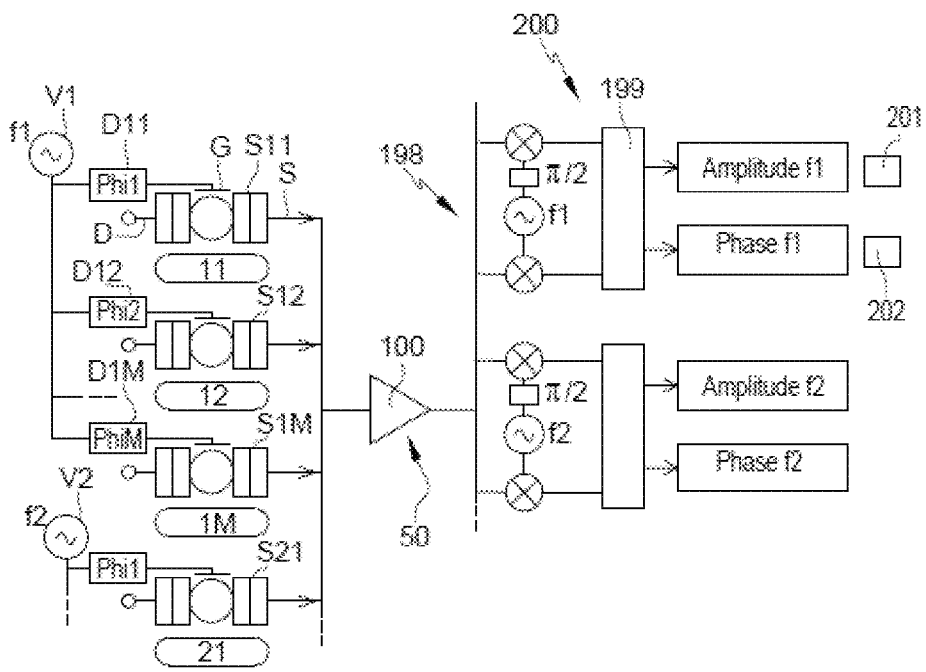
FIGS. 1A and 1B are representations of a qubit read circuit according to the principles of the invention.

FIG. 1A With reference to FIG. 1A, a qubit read circuit according to one embodiment of the invention has been shown. It is based on read-out of charge, with frequency-division demultiplexing.

It is built around spin qubits on silicon, the qubits being placed in a cryostat at very low temperature, and, in the described example, at less than one kelvin (1 K). The spin qubits are each capacitively coupled to one single-electron transistor (SET), which is placed in contact therewith in the cryostat.

Qubits have been shown, these here forming two groups, the first group being referenced qubit 11, qubit 12, . . . qubit 1M and the second group being referenced qubit 21, . . . ; however, the invention uses a larger number of qubits, for example of the order of ten, of one hundred or more, grouped into a number n of groups each comprising a number M of qubits, M being a natural number at least equal to 2, which may vary from one group to another. The number n of groups is at least 1.

The associated SETs, one per qubit, are respectively referenced SET S11, SET S12, . . . . SET S1M and SET S21 . . . . They each have a gate G or a plurality of gates, as well as a source S and a drain D, which are identified in the figure for SET S11. Depending on the spin of the qubit (i.e. its state, since it is a spin qubit), the conductance of the SET varies. This effect is generated by an interaction between the respective quantum dots of the qubit and of the SET.

The drains D of the SETs are connected to one or more constant (or optionally non-constant) potentials, and therefore, depending on the spin of the qubit, the SET delivers a current to its source S, or does not deliver a current to its source S, or indeed depending on the circumstances delivers either of two current levels that are distinct and both non-zero.

The groups of qubits are also groups of SETs, as each qubit is associated with one SET that is specifically dedicated to it.

The SETs are excited by voltages, typically sinusoidal voltages (but possibly square-wave or triangular-wave voltages) delivered by voltage generators, as shown in the left-hand part of the figure. Each SET is excited separately via its gate G (this is what is shown in the figure) or via its drain D (not shown). The SETs of a given group are excited with the same frequency, which is generated by a voltage generator common to these SETs (or optionally by distinct but synchronized generators). There are thus n sinusoidal voltage generators of different frequencies, there being one such generator (or sets of distinct but synchronized generators) per group of SETs. Thus, in FIG. 1A, the SETs S11, S12 . . . and S1M are excited by a sinusoidal voltage generator V1 of frequency f1, and the SET S21 is excited by a sinusoidal voltage generator V2 of frequency f2.

The n generators V1, V2 . . . are placed, in the embodiment shown, at room temperature and generate signals of a few mV, at frequencies ranging from 1 MHz to about 100 MHz. They are each connected by a transmission line, which penetrates into the cryostat, to the SETs of the qubits of the group of qubits that receive the frequency generated by the generator in question. Nevertheless, it is also possible, in one variant, to place the n generators in the cryostat, this making it possible to avoid the need to run cables, for excitation purposes, from outside the cryostat into its internal space. The invention nevertheless makes provision for the phase shifters to be at a stage of lower temperature than the generators V1, V2 . . . .

A phase shift (or more simply phase, for the sake of brevity), which is possibly associated with an amplitude attenuation, and which is specific to each SET, is inserted between the generator of its group and the gate of the particular SET, by phase shifters D11, D12, . . . . D1M and D21 . . . . These distinct shifts are in number the same as the SETs of the group in question, which number is, for the first group shown in the figure, equal to M, as has already been mentioned. Phases Phi1, Phi2 . . . and PhiM (between 0 and 2π) are thus inserted between the generator V1 and each of the SETs S11 . . . . S1M, respectively. Other phases, identical to the phases Phi1, Phi2 and PhiM or different therefrom, are inserted between the generator V2 and the SETs of the second group, which first and foremost includes, in the figure, the SET 21, the only one that has been shown, for the sake of simplicity. Other phases are further inserted, SET by SET, between the voltage generators of other frequencies, different from f1 and f2, and the SETs of other groups of SETs, not shown in the figure. Passive phase shifters (such as for example a difference in interconnection length such as an additional length of cable, coaxial cable for example, of a length inducing a phase shift and optionally a significant amplitude attenuation) are, in one embodiment, used to construct, very simply, the phase shifters D11, D12, . . . . D1M and D21 . . . . The phase shifters may also be injection-locked oscillators or chains of CMOS inverters.

The output currents of the SETs, which appear on their source S and which are of the order of one nanoampere (nA), are collected and summed on a conductive line 50 in close proximity to the SETs, in the cryostat of the qubits. This line is common to all the qubits of a group of qubits (here the qubits 11, 12, . . . 1M in the case of the first group), or even, as in the example shown in the figure, to the qubits of all the groups (here the qubits 11, 12, . . . 1M, 21 . . . ).

The current resulting from the addition of the currents collected and summed on this line is amplified by an amplification chain 100 (comprising one or more amplifiers), then read by a demodulation circuit 200 shown in the right-hand part of the figure. The reading time increment is of the order of one microsecond (μs), comparable with the order of magnitude of the phenomenon of decoherence of spin qubits on silicon.

Thus, by means of what has just been described, phase-division multiplexing and also, if there are at least two groups of qubits, this being the case in the figure, frequency-division multiplexing is achieved on the transmission line 50 during collection of currents. A plurality of qubits are excited with a voltage at the same frequency, but with a phase specific to each qubit. Thus, the number of qubits per frequency is M.

The choice of the frequencies such as described above and, and this is novel and original, the choice of the distribution of the phases and of the amplitude attenuations are flexible, and may be decided after manufacture of the circuit, and also modified for a given circuit, since they are not set by the electrical components, in particular the components placed in the cryostat.

The one or more demodulation chains forming the demodulation circuit 200 may be constructed in integrated or non-integrated form and they may be chains by which demultiplexing is analogue or digital, the result finally being digitized in the proposed variants.

FIG. 1A shows chains that are distinct by frequency (one chain for f1 in the upper part of the figure, then one chain for f2, and other chains for the other frequencies that are not shown, but that may be present), in which mixers generate the I component and the Q component using two waves of frequency f1 phase-shifted from each other by 90°, thus forming quadrature demodulation means 198. The I and Q components are then processed, for each frequency, by analogue-to-digital converters 199.

The demodulation circuit 200 may be placed at various temperatures: the temperature of the qubits (less than 1 K), room temperature (about 300 K), or an intermediate temperature (for example 4 K), in which case it may be advantageous, but not obligatory, to also place in the vessel of the temperature stage of this intermediate temperature the frequency generators V1, V2, . . . , to make their signal available for the purpose of carrying out the mixing necessary to extract the I and Q components.

The embodiment shown in addition combines phase- and frequency-division multiplexing. For n different frequencies, with M different phases, it is possible to read n*M qubits while generating only n frequencies and while having only n IQ demodulation chains, namely one for each frequency.

There need be only one output cable run from the coldest temperature stage, for n×M qubits, this output possibly occurring before or after the amplification chain 100, or between two successive segments of the latter.

There is little cross talk between the qubits because the excitations are separated physically, this being achieved by means of the distinct interconnections bearing the phase shifters D11, D12, . . . . D1M, D21 . . . , which are different for each qubit, even within a given group of qubits excited at the same frequency.

The amplification chain 100 comprises a transimpedance amplifier (TIA) (which converts a current into a voltage) placed, for example, at the same temperature as the qubits, i.e. in the described embodiment at less than 1 K. In the embodiment of FIG. 1A (or FIG. 1B), the gain of the read chain is generated entirely by the TIA, which is able to amplify the output current of the SETs, which is of the order of a few nA. For this purpose, the TIA has a gain of the order of 1,000,000 V/A or more. Moreover it has, given the read time of the order of one μs, a bandwidth of the order of a few tens of MHz. A TIA with a low power consumption (of the order of one hundred μW) is selected, this allowing it to be placed in the cryostat right by the qubits, and at the same temperature as them, i.e. at a temperature of the order of 100 mK. Naturally, a low-noise TIA is selected. A TIA with a capacitive-feedback architecture, as disclosed by Razavi, 2000, is used in one particularly advantageous variant.

The signal on the radiofrequency transmission line 50, before demodulation, but after conversion by the TIA, is an output voltage.

The IQ demodulation extracts the complex I and Q components of the signal and transmits them to an analogue-to-digital converter 199, which makes it possible to place the amplitude and phase of the signal in the complex plane. These have been depicted in the form of constellations of points called symbols corresponding to combinations of the states of the qubits excited at the frequency used for the demodulation chain in question. These constellations will be discussed below.

Preliminary characterizations of the response, seen by the demodulation circuits 198, of the qubits to the excitations at the various frequencies f1, f2, . . . as a function of the states of the qubits will have been stored in memories 201 (or at memory addresses) of the demultiplexing circuit 200, in association with each frequency f1, f2, . . . . These preliminary characterizations are compared, by discriminating means 202, with the complex measured I and Q components, with a view to recognizing the current combination of states (the current symbol) of the qubits excited at the frequency in question. The discriminating means 202 may be an application-specific integrated circuit (ASIC) or a digital signal processor (DSP).

A similar discriminating means (not shown), which may be the same ASIC or the same DSP, is provided to process the information obtained by the demodulation chain handling the frequency f2. It allows the state of the qubit 21 and of other qubits not shown in the figure to be deduced from the multiplexed signal. The same goes for the other frequencies used (not shown).

Figure 1B:
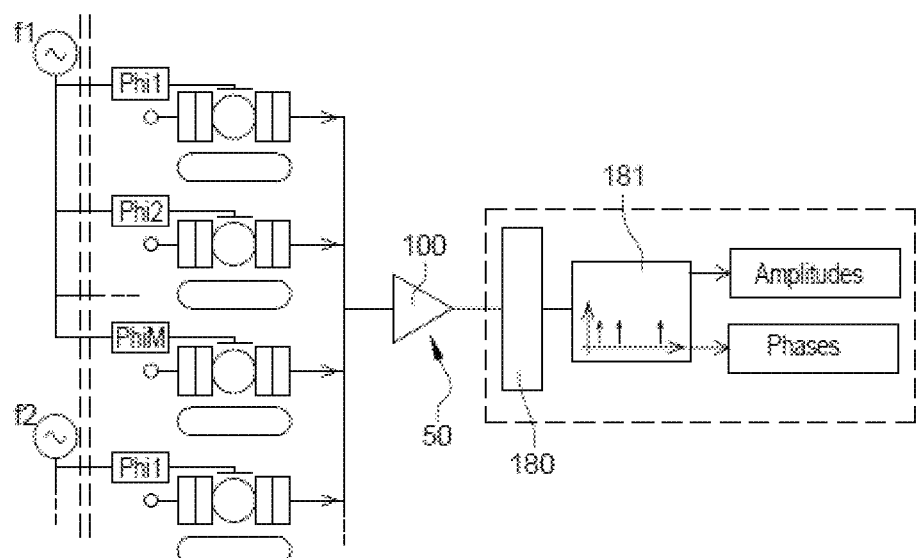

FIG. 1B With reference to FIG. 1B, a qubit read circuit according to a second embodiment of the invention has been shown. It is based on read-out of charge, with frequency-division demultiplexing, and employs elements of the circuit of FIG. 1A.

The qubits, the SETs, the generators and the phase shifters are arranged and connected together as in FIG. 1A. An amplification chain 100 is present at the output of the SETs and this time leads to an analogue-to-digital converter 180, which digitizes the output signal over the entire bandwidth. Thus, the analogue-to-digital converter 180 processes the signals at the various frequencies f1, f2, . . . . For this purpose, a converter is selected the bandwidth of which extends up to a frequency twice the maximum limit of the bandwidth of the amplification chain (the TIA, and/or a voltage/voltage amplifier).

The output of the analogue-to-digital converter 180 is handled and processed by a fast-Fourier-transform module 181, in an ASIC or DSP, which provides (or projects) an amplitude and a phase in the complex plane separately for each of the frequencies f1, f2, . . . .

Figure 2:
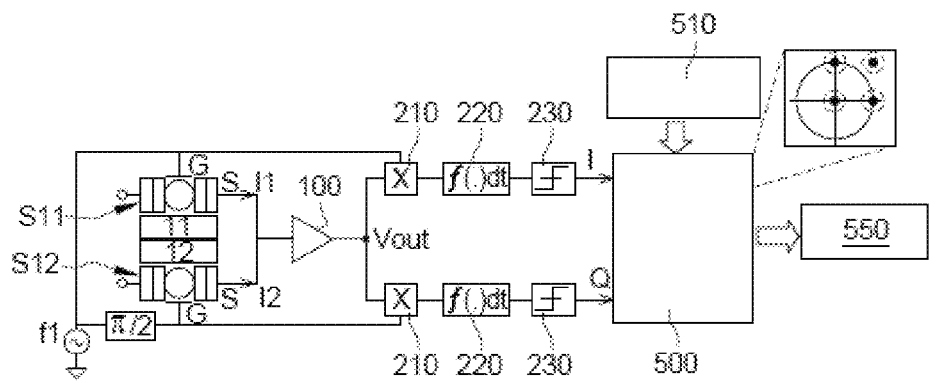
FIG. 2 shows one particular aspect of the invention.

FIG. 2 shows the IQ demodulation used, in the case of two phases separated by $\pi/2$ and of a single frequency f1. Other frequencies may be processed by parallel demodulation circuits downstream of the transimpedance amplifier TIA, this then allowing a plurality of pairs of qubits placed upstream of the TIA to be read, with one frequency per pair of qubits.

Considering FIG. 2, in which only one frequency is used, a given sinusoidal excitation voltage at the frequency f1 is generated and sent to the gate of both SETs of the system. For one of the transistors, it is applied directly, to the gate of the SET coupled to qubit 1. For the other transistor, it is phase shifted by another Phi value before being applied to the gate of the SET coupled to qubit 2. Here, the value Phi=$\pi/2$ has been selected.

As mentioned in the introduction, the SETs exhibit different behaviours depending on the state of the qubit coupled to them. If the coupled qubit is in state 1, the SET transmits to its output in the form of a current the excitation applied to its gate, in particular in a way reproducing the frequency f1 and the phase (here, 0 or $\pi/2$). If the qubit coupled to the SET is in state 0, the SET will not transmit its excitation, and no current will be present on the output of the SET. The presence or absence, on the output of each SET, of the pair consisting of the excitation frequency and specific phase is thus dependent on the state of the qubit coupled to the SET.

The currents of the SETs are summed then the sum is applied to the input of the amplification chain 100, which comprises a transimpedance amplifier TIA that converts it into a voltage and amplifies the signal.

The information consisting of the state of each qubit is then extracted from this signal. Two channels are used, with one channel extracting the information contained in the signal that has not been phase shifted, and which is conventionally called the I signal, and one channel extracting the information contained in the signal that has undergone a quadrature phase shift (of $\pi/2$ or $-\pi/2$), and which is conventionally called the Q signal.

The setup in FIG. 2 takes advantage of the fact that the phase applied to the SET S12 is $\pi/2$, this meaning that the same phase shifter is used in two different circumstances (the phase shift of one SET with respect to the other, and then the IQ demodulation); however, if the phase applied to the SET S12 is some other phase, it is necessary to have a $\pi/2$ phase shifter for the demodulation and another separate phase shifter, of phase Phi, for the SET S12 (this being what is envisaged in FIG. 1A, which nevertheless illustrates a higher number of phases).

The demodulator uses two chains in series, each consisting of a multiplier 210, an integrating filter 220 and a comparator 230, to convert the information contained in the two (I and Q) signals into two binary words of 1 bit each. A 1-bit analogue-to-digital converter is thus formed, consisting of the series connection of the multiplier, an integrator and a comparator. The amplified signal delivered by the TIA and the reference sinusoidal voltage (which are phase shifted from each other by $\pi/2$) by which the amplified signal is multiplied are applied to the input of the chain, and, at the output of the chain, the information delivered simultaneously by the two comparators 230 is collected for a sufficient time then decoded by a digital threshold comparator 500 using lookup tables 510, for example via extraction based on region of interest (ROI), allowing the current combination 550 of the states of the qubits 11 and 12 to be deduced unequivocally and reliably. The digital threshold comparator takes the form of an ASIC or DSP, and is a means for discriminating between the states of the qubits excited at the frequency f1.

In more detail, the signal output from the TIA ($V_{out}$) is multiplied by the same excitation signals (discounting the phase difference) as those applied to the respective SETs, this making it possible to test the two channels to determine the presence therein or absence therefrom of the excitation frequency. If the frequency is present in $V_{out}$, the output of the corresponding multiplier 210 has a voltage that has a DC component in addition to a sinusoidal component. If the frequency is absent, then a sinusoidal signal without a DC component (or even no signal) is delivered to the output of the multiplier.

The integrator 220 integrates the DC component of the voltage, if it is present, in the form of an output ramp that eventually reaches a calibrated threshold in the comparator 230, the output of which passes from a high level (0) to a low level (1). If no DC voltage is present at the output of the multiplier, then the output of the integrator does not reach the threshold of the comparator, the output of which remains at 0 (high level).

The state of the qubits is thus expressed, at the output of the two comparators, in the form of two voltage levels that may be interpreted as two logic levels and therefore two binary words. The generated binary words are compared with predetermined thresholds stored in the lookup table 510, to determine the states of the qubits 550.

Figure 3:
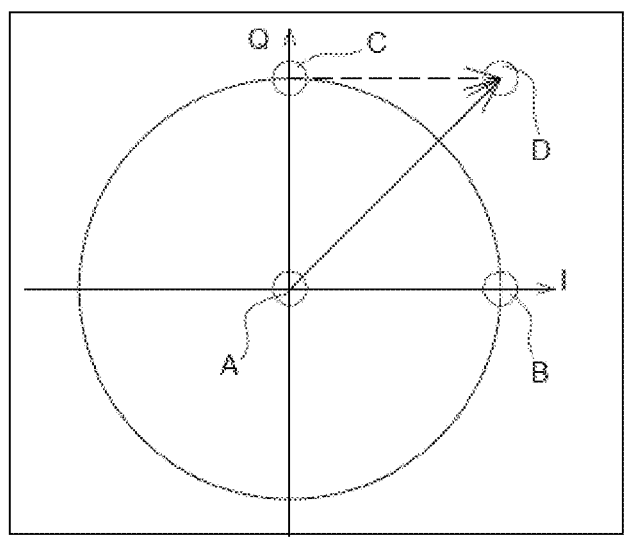
FIG. 3 shows a first example of use of qubit read-out according to the invention, in a case with 2 different phases and one frequency arranged in a simple manner.

FIG. 3 A constellation in the complex plane for two phases per frequency is shown in FIG. 3. Thus, two excitation signals at the same frequency are sent to a first SET and a second SET, respectively, but with a phase difference between the two signals. The figure shows the complex IQ space. By convention the first phase is at 0 radians, the second phase for its part in this embodiment being at $\pi/2$ radians. The signals may be represented by points called symbols in the IQ plane or as vectors I+jQ.

There are therefore four possible combinations of states depending on whether the first qubit is in state 0 or 1 and whether the second qubit is also in state 0 or 1. The figure shows the signal for these various possibilities.

|              | Qubit1 = 0 | Qubit1 = 1 |
|--------------|------------|------------|
| Qubit2 = 0   | Signal A   | Signal B   |
| Qubit2 = 1   | Signal C   | Signal D   |

The phase and amplitude of the sum of the output signals of the various SETs ($I_{out}$ in FIG. 1A) thus depend on the state of the qubits, in the form of an addition of complex numbers or of vectors. Thus, FIG. 3 shows that D=B+C.

Figure 4:
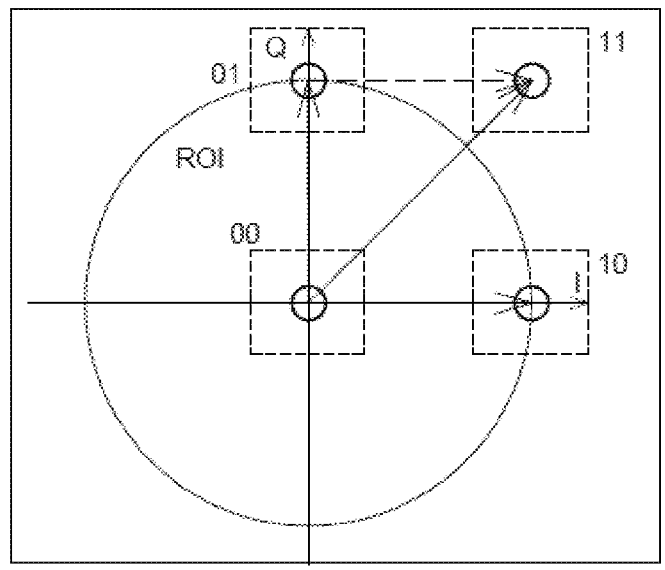
FIG. 4 shows implementation of one aspect of one embodiment of the invention, in the context of the case of FIG. 3.

FIG. 4 The combinations of states are, in one embodiment, discriminated between in the complex plane via various techniques that rely on prior calibration of the output constellation through application of multiple occurrences of each combination of input states. On the basis of this statistically determined constellation, an unambiguous way of identifying each combination of states in the demodulated signal under the operating conditions of the quantum device is obtained.

One method is to place boundaries in the complex plane, using the ROI technique (ROI standing for region of interest). The ROI may use square, circular or elliptical boundaries, or indeed boundaries of any shape that may prove advantageous, in the complex plane: within these closed curves defining regions of the plan, a positive signal indicates the presence of the combination of states associated with the region of the plane at the end of the prior characterization. The characteristic size of the regions of the complex plane in the ROI technique depends directly on the desired read fidelity, read noise and signal integration time. There is therefore a compromise between the number of qubits read simultaneously and the fidelity of each read, for a given TIA and read time.

Figure 5:
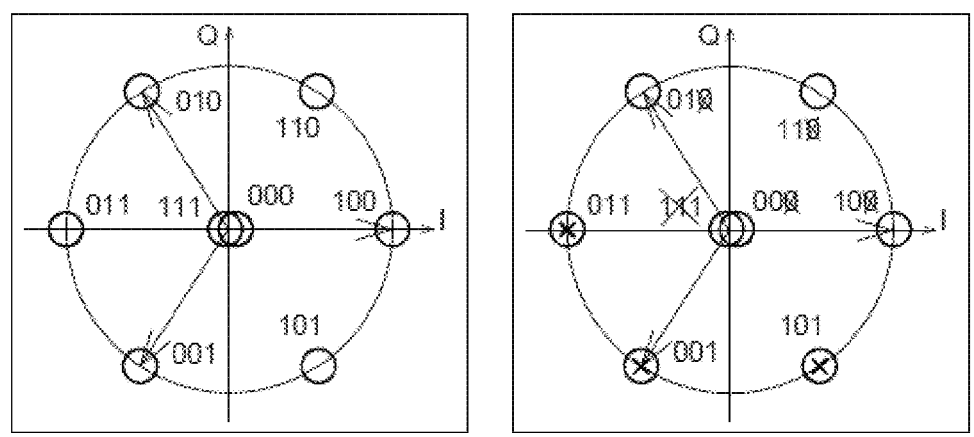
FIG. 5 shows, on the left, one implementation for 3 phases which is not preferred, but which is used for the purposes of explanation, and, on the right, one example of read-out of qubits according to the invention for 2 phases, which is based on the distribution described, with reference to the left-hand part of the figure, for 3 phases.

FIG. 5 If the number of SETs and qubits is greater, and there are then m different phases, there are 2^m (m to the power of 2) possible combinations of states.

If the selected phase distribution has symmetry (which is possible when two phases are used, but has been avoided in FIGS. 2 to 4), combinations of states superpose, this preventing all the information present in the qubits from being read. To overcome this difficulty, phase and amplitude distribution schemes are employed, to eliminate or reduce symmetries in the constellations of state combinations and thus make it possible to read all the information present.

In one embodiment, the number of different phases is a number less by the value 1 (i.e. less by one unit, or equal to the difference between the selected number and the number 1) than a selected prime number greater than or equal to 3 (3, 5, 7, 11, etc.).

Once the number of phases has thus been determined, they are equi-distributed in the interval 0 to $2\pi$ around the unit circle, but as though an additional phase were present, and their number was actually equal to the selected prime number. One position provided is therefore left unoccupied.

Thus, if the prime number used is p, the equi-distribution employed will have a pitch of $2\pi/p$ radians, but only p−1 phases on this distribution will be occupied, one of the places remaining unoccupied, the last for example.

By virtue of this method, the combination of states that is composed only of 0's and the combination of states that is composed only of 1's are distinct, due to the inoccupancy of one of the places, and all the combinations containing 0's and 1's are also distinct, because of the primeness of the selected number.

This is illustrated in FIG. 5 for p=3. The figure shows, on the left, the constellation of combinations of states that may be envisaged as long as all the places defined for 3 phases are occupied. It is possible, by leaving one or other of the 3 places unoccupied, which is done in the right part of the figure, to obtain in the complex plane one separate symbol for each combination of states. In the figure, symbols 010, 110, 000 and 100 are used, symbols 011, 001, 111 and 101 no longer featuring, because if all positions of the equi-distribution had been used, symbols 000 and 111 would have been superposed, undesirably. The third digit is always 0, and the four symbols featuring in the constellation are 01 in the upper left quadrant, 11 in the upper right quadrant, 00 in the centre of the plane, and 10 on the x-axis on the positive side.

This is an alternative to the distribution depicted in FIG. 3, which also had the property of discriminating combinations for two phases.

Figure 6:
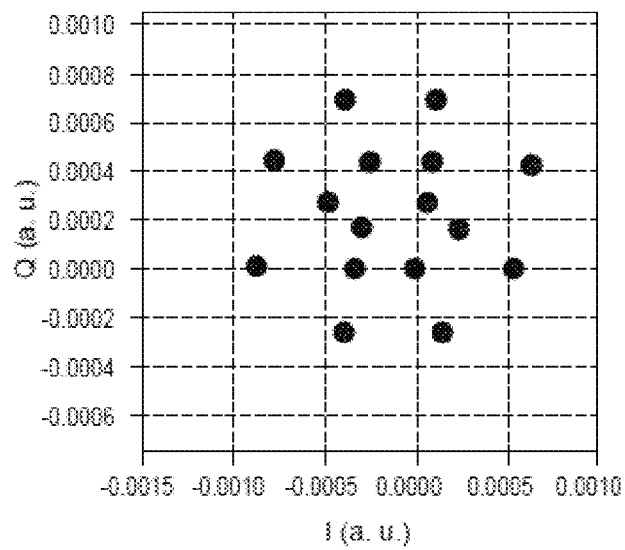
FIG. 6 shows one example of a constellation of the possible combinations, in the context of one particular implementation with 4 phases per frequency.

FIG. 6 This is also illustrated in FIG. 6 for p=5, and use of 4 phases, 5 as known being a prime number. Shown is the constellation of the possible combinations of states with 4 phases per frequency in a 5-phase equi-distributed distribution.

This figure was obtained taking into account a transimpedance amplifier gain of $10^6$ V/A, an amplifier bandwidth of 40 MHz, a single-electron transistor current of 1 nA, and an equivalent input noise of $0.1 \times 10^{-27}$ A²/Hz. It may be seen that the symbols are quite distinct and cannot be confused.

The number of phases implemented for a given frequency is essentially limited by the noise of the amplification chain. Specifically, the standard deviation or dispersion of each symbol and therefore the risk that they will partly superpose are related to the noise of the amplification chain, and to the read time.

Figure 7:
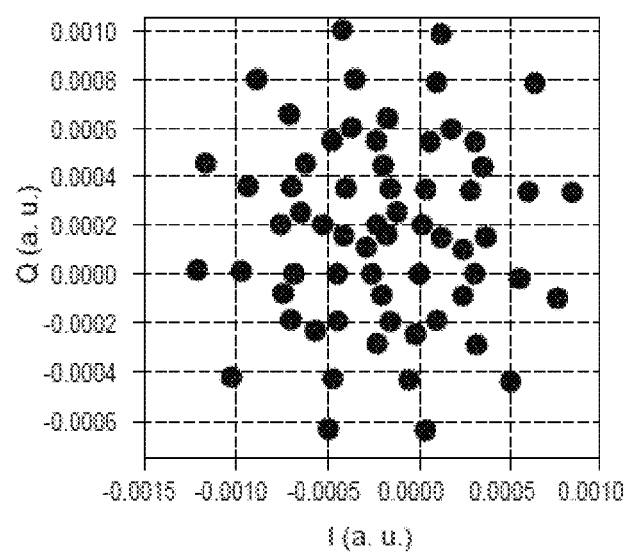
FIG. 7 shows one example of a constellation of the possible combinations, in the context of one particular implementation with 6 phases per frequency.

FIG. 7 shows a constellation of 6 phases per frequency distributed in an equi-distributed distribution for 7 phases (7 being a prime number as already mentioned), once again taking into account a transimpedance amplifier gain of $10^6$ V/A, an amplifier bandwidth of 40 MHz, a single-electron transistor current of 1 nA, and an equivalent input noise of $0.1 \times 10^{-27}$ A²/Hz).

Figure 8A:
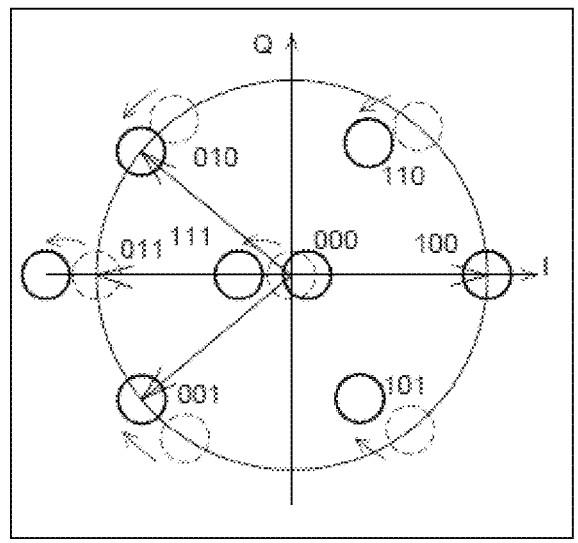
FIG. 8A shows another example of read-out of qubits according to the invention, but with three phases and one frequency, and an implementation different from the one depicted in FIGS. 3 to 7.

FIG. 8A In another embodiment, illustrated in FIG. 8A, the signals corresponding to the symbols with a single 1 value are distributed in the interval 0 to $2\pi$ radians in a regular first-order (or first-instance) distribution comprising, however, in a smaller order of magnitude (or second analysis), a phase shift intended to suppress the superposition between symbols containing only 0's and containing only 1's.

The number of different qubits is this time a prime number greater than or equal to 3 (3, 5, 7, 11, etc.), and the signals corresponding to the symbols with a single 1 value are equi-distributed in the interval 0 to $2\pi$ around the unit circle (with equal amplitudes), all the places thus defined being occupied by one qubit. Thus, if the prime number is p, an equi-distribution with a pitch of $2\pi/p$ radians is provided, and the p signals corresponding to the symbols with a single 1 value are placed on this distribution, all the places being occupied.

Thus, all the combinations containing both 0's and 1's are distinct, because of the prime character of the selected number.

The shift mentioned above is employed to make it possible to distinguish between the remaining combinations, namely the combination that contains only 0's, and the combination that contains only 1's, which, due to the symmetries, run the risk of being superposed if no measures are taken.

Thus, certain symbols with a single 1 value are moved slightly, so that the symbols containing only 0's and containing only 1's no longer superpose.

An illustration is shown in FIG. 8A for the case where p=3, in which the second and third symbols containing a single value 1 have been moved (from the configuration of the left-hand part of FIG. 5) along the unit circle, to move them away from the point (I=1; Q=0), this resulting in a movement of the combinations of states 010 and 001 along the unit circle and of the combinations of states 110, 011 and 101 outside it.

These movements do not negate the ability to distinguish between these combinations of states and others, and also has the consequence of generating a shift between the combinations of states 111 and 000 (it is 111 that moves), this making it possible to distinguish between them, this not being possible without the shift applied to qubits 2 and 3.

Alternatively, more than a single pair of phases could simply be shifted. Indeed, one of the phases could simply be shifted towards the other, while leaving the other phase where it was.

Specifically, the provided figure shows the described case, but the idea behind it is above all the addition of a singularity of any type to the distribution.

Figure 8B:
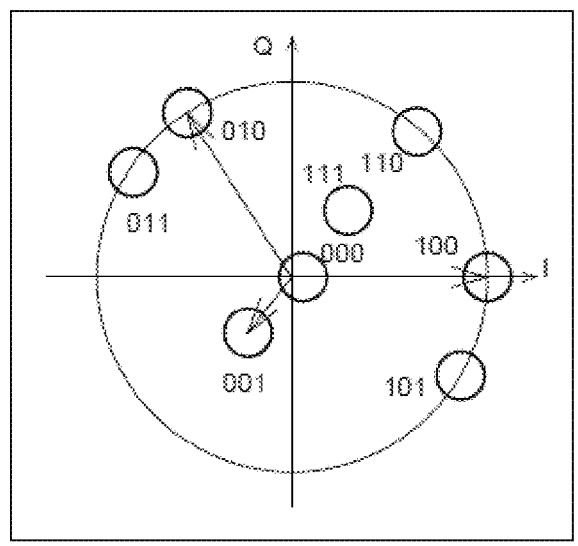
FIG. 8B shows another example of read-out of qubits according to the invention, again with three phases and one frequency, and an implementation different from the one shown in the preceding figures.

FIG. 8B In another embodiment, illustrated in FIG. 8B, the signals corresponding to the symbols with a single 1 value are distributed in the interval 0 to $2\pi$ radians in a regular distribution comprising, however, an amplitude shift intended to suppress the superposition between the symbol containing only 0's and the symbol containing only 1's.

The number of signals corresponding to the various symbols with a single 1 value (i.e. the number of qubits) is again a prime number greater than or equal to 3 (3, 5, 7, 11, etc.), and the signals corresponding to the symbols with a single 1 value are equi-distributed (as in FIG. 8A), to a first approximation, in the interval 0 to $2\pi$ around the unit circle, all the places thus defined being occupied by a signal.

An amplitude shift is introduced into one of the signals corresponding to a symbol with a single 1 value, so that symbols containing only 0's and containing only 1's are no longer superposed.

An illustration is shown in FIG. 8B for the case where p=3, in which the signal 001 has been moved outside the unit circle, to move it closer to the point (I=0; Q=0), this resulting in a movement of the symbols of the combinations of states 011, 101 and 111.

These movements do not negate the ability to distinguish between these combinations of states and others, and also has the consequence of generating a shift between the combinations of states 111 and 000 (it is 111 that moves), this making it possible to distinguish between them, this not being possible without the shift applied to qubit 3.

Figure 8C:
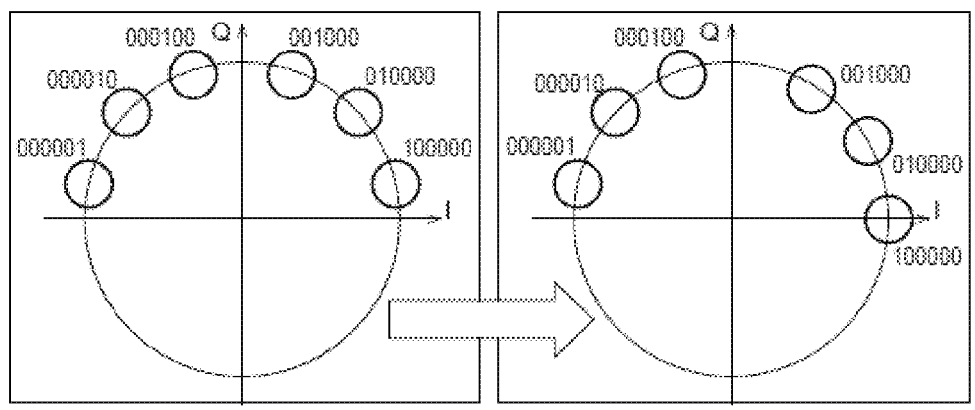
FIG. 8C shows another example of a distribution, of combinations of states composed of a single 1, in the IQ plane.

FIG. 8C In another embodiment, four phases are regularly distributed over a single half of the unit circle, through selection of phases equal to $\pi/8$, $3\pi/8$, $5\pi/8$, $7\pi/8$ for each of the signals corresponding to a symbol with a single 1 value. Due to the distribution over half of the unit circle, the symmetry of the combination of states 0 . . . 00 and the combination of states 1 . . . 11 is broken. In addition, due to the semi-circular distribution, the amplitudes no longer cancel one another out, but add up, this solving the symmetry problems associated with a selection of 4 phases per frequency.

In order to generalize this technique of distribution over a unit semi-circle to a maximum number of phases, small adjustments are made. Specifically, beyond 4 phases per frequency, it is necessary to induce a shift, for example in the distribution of the phases of a single quarter of a unit circle. Or indeed, as above for a distribution on a complete circle, it is possible to apply a shift to one or more phases. Thus, any symmetry is broken and the distribution is normally compatible with any number of phases. It is also necessary to avoid, when placing an odd number of phases, placing one phase at the centre of the semi-circle.

FIG. 8C shows an off-axis equi-distributed distribution on a semi-circle.

Thus, as has already been said, more than one qubit is read per frequency while the same excitation frequency is assigned to each qubit, but with a phase and amplitude that differs in each case. The phase and amplitude of the output signal composed of the sum of the output currents $I_{out}$ of the transistors change depending on the state of each of the qubits excited at the frequency in question. Finally, this phase and amplitude information is extracted through use of IQ demodulation. The combinations of qubit states then take the form of a constellation of symbols that it is possible to interpret, in particular via digital decoding.

FIGS. 8D, 8E, 8F and 8G show two other possible and advantageous phase distributions. These are both similar to a QAM constellation, which is known to be optimized in terms of the spacing between symbols (or combination of states).

Figure 8D:
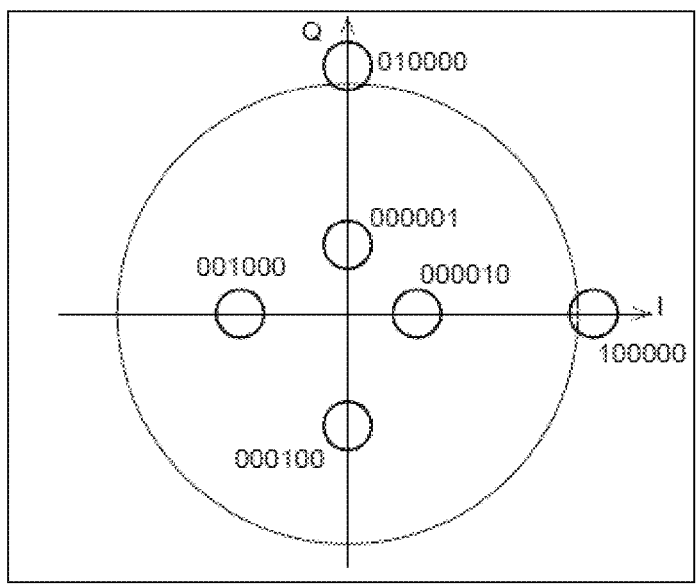
FIG. 8D shows yet another example of a choice of excitations.

In FIG. 8D, an amplitude and phase distribution is laid out on a complete unit circle (360°). To assign a phase to the various ordered qubits, the phases are successively incremented by $\pi/2$ radians on passing from one qubit to the next qubit in the list. The amplitudes, for their part, are selected in the following way: from n=1, for odd n, the same amplitude is assigned to qubit n and to qubit n+1 and the amplitudes are assigned to each successive odd number by dividing the previous amplitude by 2. The distribution obtained for 6 qubits is shown in FIG. 8D.

Figure 8E:
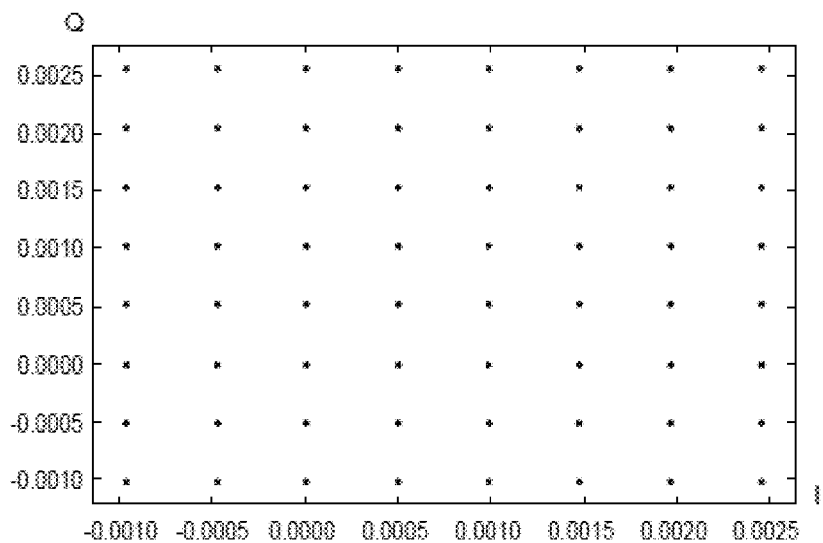
FIG. 8E shows the associated read constellation in the IQ plane.

FIG. 8E The resulting combinations of states are shown in FIG. 8E. It is possible to place any number of qubits per frequency, whether this number is prime or not. The IQ plane is optimally occupied.

Figure 8F:
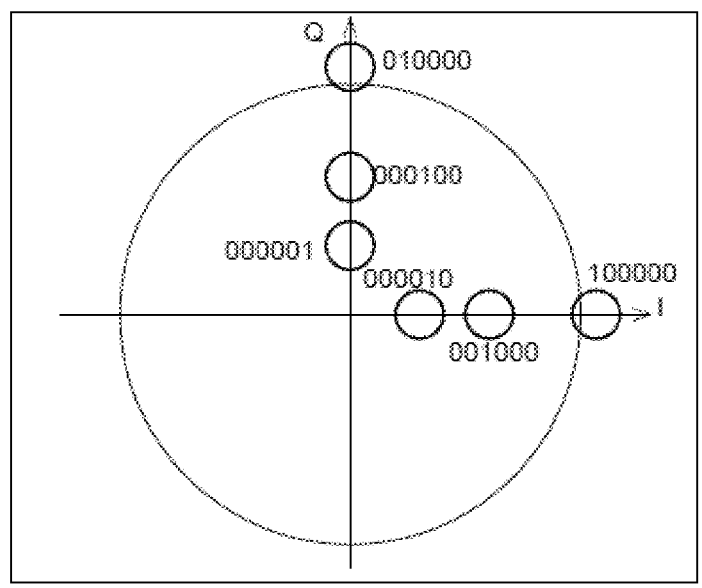
FIGS. 8F and 8G conjointly show yet another example.

FIG. 8F In another variant, the phases are alternately 0 and $\pi/2$ (or any other pair of phases separated by $\pi/2$). Next, the amplitudes are assigned as above: from n=1, for odd n, the same amplitude is assigned to qubit n and to qubit n+1 and the amplitudes are assigned to each successive odd number by dividing the previous amplitude by 2. The distribution obtained for 6 qubits is shown in FIG. 8F.

Figure 8G:
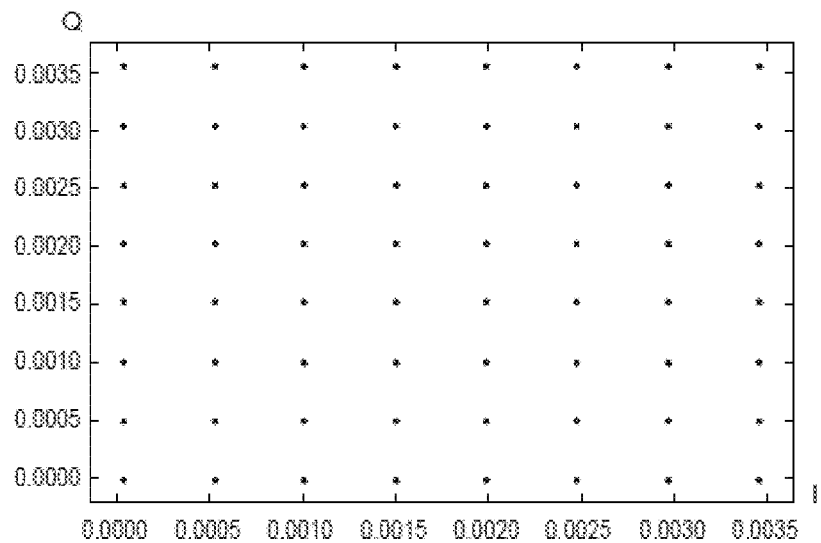

FIG. 8G The resulting combinations of states are shown in FIG. 8G. Again it is possible to place any number of qubits per frequency, whether this number is prime or not. The first quadrant of the IQ plane is still optimally occupied.

These two choices to distribute the phases in quadrature and amplitudes in powers of 2 correspond to an interpretation of the states of the qubits as negabinary words (phases of 0, $\pi/2$, $\pi$ and $3\pi/2$, the phases of $\pi$ and $3\pi/2$ being equivalent to amplitudes of powers of −2) or binary words (phases of 0 and $\pi/2$) on each I and Q axis, respectively.

These phase and amplitude distributions are powerful in terms of IQ-plane occupancy.

In a circuit in which the main objective is to respect a read time of 1 to 2 µs, it is proposed to place 2 or 3 phases per frequency. In a circuit where the priority is to increase the number of qubits even at the expense of a longer read time, it is proposed to place 4 or 5 phases per frequency for a read time of about ten µs.

Through use of a plurality of frequencies, the read chain is able to reach about one hundred qubits with only a single electric cable running from the cryostat enclosing the qubits, with a read time of 1 µs and a consumption of the order of 100 µW.

FIGS. 9 to 12 show two frequency generators f1 and f2, two qubits being probed by frequency generator f1 and one qubit being probed by frequency generator f2; however, this number of qubits is non-limiting and has been selected for its ease of illustration. The invention will often employ a higher number of frequencies, and a plurality of, and often more than two, qubits per frequency. This is not discussed with reference to FIGS. 9 to 12, but rather the temperature at which the amplification chain and phase shifters are installed. The two phase shifters shown for frequency f1 are denoted φ11 and φ12 and the phase shifters for frequency f2 have not been shown. They are installed at a stage of lower temperature than the frequency generators f1, f2 . . . , and a single cable, per frequency, penetrates their temperature stage from outside this temperature stage (it is a question of penetrating a cryostatic vessel), this cable being parallelized into a plurality of cables carrying the same frequency inside the temperature vessel of the phase shifters.

Figure 9:
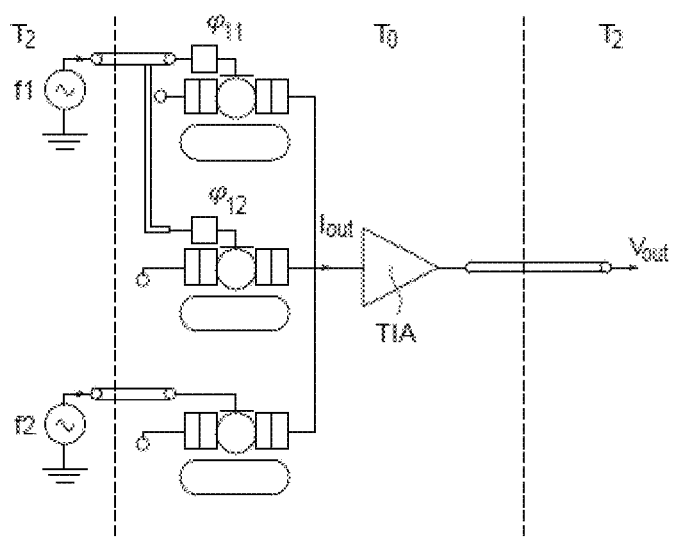
FIGS. 9 to 12 show four technical variants of implementation of a qubit read circuit according to the invention.

The amplification chain essentially consists, in one embodiment shown in FIG. 9, of a TIA in the cryostat of the qubits and SETs, and therefore at a very low temperature T0 (less than 1 K in one embodiment), as shown in FIG. 9. The input capacitance of the TIA (which is related to the length of the input line) may be small, this being advantageous; however, the output capacitance (which is related to the length of the output line) is in contrast inevitably quite high, this potentially being disadvantageous, just like the fact that the TIA, which must generate a high gain, of the order of $10^6$ V/A, must consume little, of the order of 100 µW, and not produce noise in an amount such as to prevent read-out with a fidelity greater than 99.99% in a few µs. Placing the TIA in the cryostat therefore places constraints on the TIA, which it is proposed to relax by positioning, in an alternative embodiment, the TIA outside the coldest temperature stage.

The signal-to-noise ratio at the output of the amplification chain with a bandwidth of 40 MHz has a limit value of 1.383 in order to ensure a read fidelity of 99.99%, the demodulation means having a read time of the order of 1 μs. The value of 1.383 is the signal-to-noise ratio value required at the output of the amplification chain with a bandwidth of 40 MHz to achieve a bit error rate (BER) of 0.01% with on-off keying (OOK) demodulation and a read time of 1 μs (and therefore an integration time of 1 μs). OOK demodulation corresponds to the case of only 1 phase per frequency. The relationship is as follows: BER=½ erfc($\sqrt{SNR}/(2\sqrt{2})$).

The phase shifters φ11 and φ12 and the other phase shifters are placed in the cryostat of temperature T0.

Figure 10:
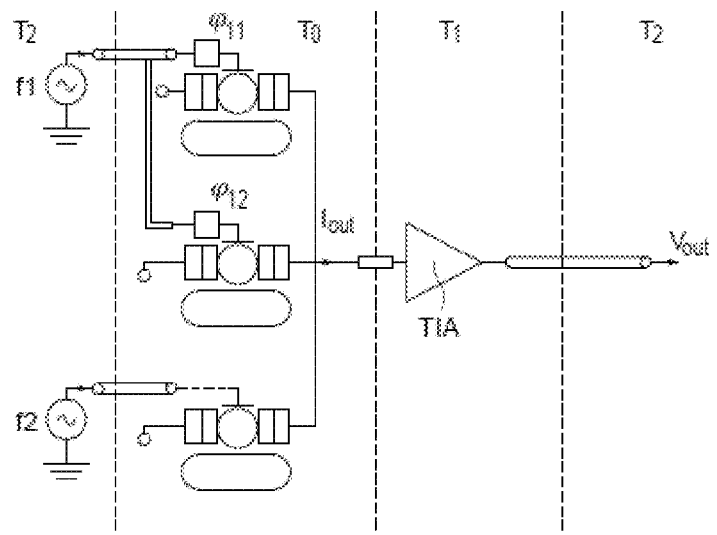

FIG. 10 Alternatively, as shown in FIG. 10, the TIA is placed in an environment of intermediate temperature T1 (for example 4 K) between the temperature T0 of the temperature stage of the spin qubits and room temperature. Here it is a question of a cryostat with successive vessels of decreasing sizes, the coldest vessel being installed in the intermediate-temperature vessel. At such an intermediate-temperature stage, the consumption budget is greater than at less than 1 K, and thus such a TIA is less constrained in consumption terms than the TIA of the previous embodiment which was placed at less than 1 K. Placing the TIA in this way thus increases operational flexibility, with respect to the previous embodiment.

Again, the phase shifters φ11 and φ12 and the other phase shifters are placed in the cryostat of temperature T0, but they could be placed in the stage of temperature T1, especially if the frequency generators are at the stage of temperature T2.

Figure 11:
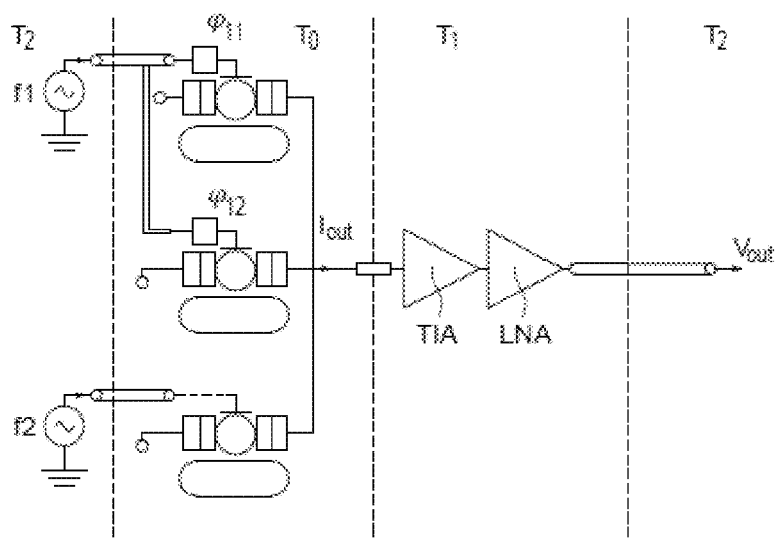
Figure 12:
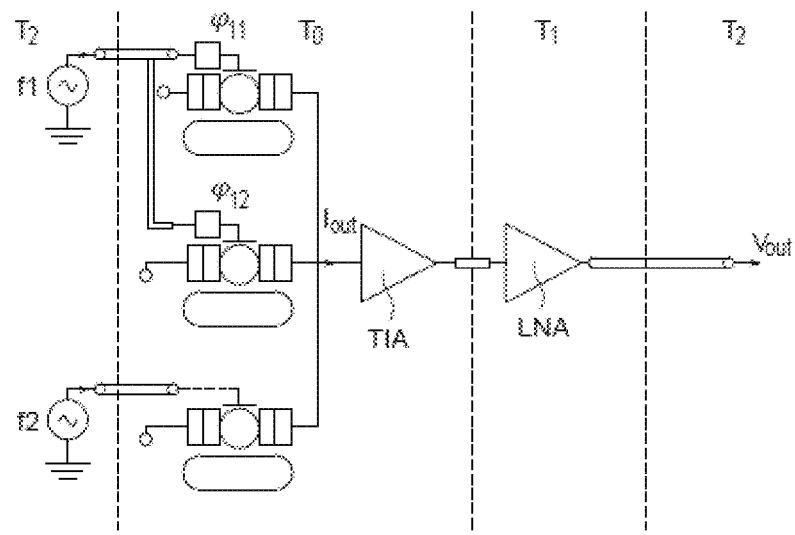

FIG. 11 In another embodiment, shown in FIG. 11, a TIA of a first gain, for example 10000 V/A, precedes on the read line (single as before) an amplifier, for example a (voltage/voltage) low-noise amplifier LNA of a second gain, for example 100. The combined effect of the two amplifiers allows an overall gain of 1000000 V/A to be obtained. The two amplifiers are physically placed in series at an intermediate temperature T1, between the temperature of the temperature stage of the spin qubits and room temperature. Here it is once again a question of a cryostat with successive vessels of decreasing sizes, the coldest vessel being installed in the intermediate-temperature vessel. Such a choice then makes it possible to relax design and operating constraints on the TIA, which with a lower gain may have a greater bandwidth, of the order of 100 MHz, without consuming more. The LNA may have a bandwidth of about 100 MHz and consume of the order of 1 mW. The TIA, which is preferably directly connected to the second amplifier to take advantage of the fact that they are in the same cryostatic vessel, and which therefore has no transmission line at its output, has a lower output capacitance, allowing a high performance to be achieved.

Again, the phase shifters φ11 and φ12 and the other phase shifters are placed in the cryostat of temperature T0, but they could be placed in the stage of temperature T1, especially if the frequency generators are at the stage of temperature T2.

FIG. 12 In another embodiment, shown in FIG. 12, a TIA again precedes on the read line a second amplifier, for example an LNA. However, the two amplifiers are in contrast physically placed in environments at different temperatures: the TIA is in proximity to the qubits and SETs in the temperature stage at very low temperature, for example at less than 1 K, and therefore has a low input capacitance, this being advantageous. Furthermore, having an intermediate-stage amplifier limits the output capacitance of the TIA, this also being advantageous. The second amplifier may be placed at an intermediate temperature.

Again, the phase shifters φ11 and φ12 and the other phase shifters are placed in the cryostat of temperature T0, but they could be placed in the stage of temperature T1, especially if the frequency generators are at the stage of temperature T2. Here it is once again a question of a cryostat with successive vessels of decreasing sizes, the coldest vessel being installed in the intermediate-temperature vessel.

The amplification chain may be constructed using a plurality of discrete circuits, and/or using one or more integrated circuits.

The TIA may have one of a number of architectures, including the capacitive-feedback or capacitive-network architecture, the push-pull architecture, the shunt-feedback architecture, or the regulated-cascode architecture. These architectures are described in the publications Razavi, 2000 and Romanova, 2019. A TIA with the widest possible bandwidth, the highest possible gain, a low power consumption and that generates little noise is preferable.

In the embodiments of FIGS. 9 to 12, the frequency generators are preferably at the same temperature as the demodulation circuit. This temperature is denoted T2, and it may be room temperature (about 300 K) but it may also be T1.

Thus, in another embodiment, the voltage generators are placed at an intermediate temperature level, which is between room temperature and the temperature of the qubits, this choice in respect of temperature potentially allowing the energy consumption of the system and the layout of cables in the cryostat to be optimized. In another embodiment, the voltage generators are placed at the temperature of the qubits, in the cryostat, this allowing the number of cables passing through and entering the cryostat to be minimized.

The voltage generators are constructed using discrete or integrated circuits. A ring-oscillator topology is particularly appropriate. In other embodiments, the voltage generators take the form of injection-locked oscillators or relaxation oscillators. The excitation generated by these voltage generators is applied to the gate of the SET in question. It is of a frequency specific to each group of qubits, to which a given frequency is assigned, and for each qubit, it is shifted by a phase and attenuated by an amplitude in accordance with the principles of the invention.

The signals of all SETs are delivered, before demodulation, to a common cable (a radio-frequency transmission line transmitting a frequency-multiplexed signal). The demodulation circuits may therefore be placed at room temperature, the number of cables passing through the cryostat being limited, since the cable is only one in number. They may also be placed at low temperature, if this is otherwise advantageous in respect of implementation.

The demodulation chain is in certain embodiments implemented in an intermediate-temperature stage, for example at a temperature between 4 K and 10 K. In these various situations, the fact that the temperature stage of the qubits, in which a temperature below 1 K is maintained, is passed through by only a single outgoing cable and does not contain demodulation electronics is advantageous.

The demodulation may be homodyne (as shown above) or heterodyne, with use of an intermediate frequency. The heterodyne solution makes it possible, in certain implementations, to decrease the noise of the demodulation chain, and to increase its bandwidth.

An analogue demodulation chain is used in one embodiment. In another embodiment, the demodulation is per-formed using a digital signal processor (DSP), and in another embodiment, an ASIC is programmed to perform the demodulation.

Discrimination is achieved using an ROI technique employing, in one embodiment, in the plane, circles or ellipses, or rectangles or even squares as discrimination shapes. It may also be done through nearest-neighbour identification.

Thus, a large number of phases per frequency is used, despite the residual noise (after all the design efforts made to reduce it) of the amplification and demodulation chain.

The phase-division multiplexing presented above applies to charge-based read-out of spin qubits on silicon, through SETs the conductance of which varies depending on the state of the qubit, but also to read-out of other quantum devices, such as spin qubits on silicon using a QPC the conductance of which varies depending on the state of the qubit.

Figure 13:
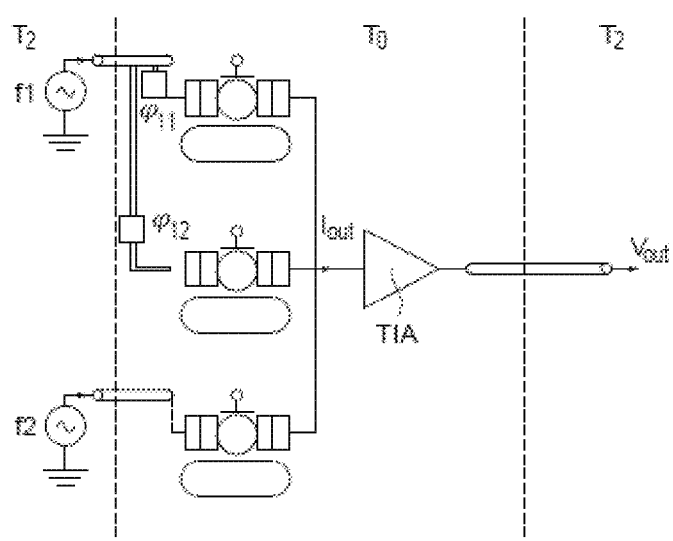
FIG. 13 shows a variant of the connection circuit of the single-electron transistors of FIG. 1A or FIG. 1B.

FIG. 13 The SETs may be connected with a view to excitation not via their gate but via their drain, as shown in FIG. 13. In this case, the gate is connected to a fixed or floating potential. It is then the drain that receives the periodic voltage, with the frequency assigned to a group of a plurality of qubits, and among these the phase assigned specifically to the qubit in question.

It will in addition be noted that the SETs, in FIG. 1A (and following figures) or in FIG. 13, may have other gates. These are connected to a fixed or floating potential.

It will also be noted that the SETs may be replaced by electrometers providing a voltage response, and the output voltages of the electrometers summed. To achieve such a summation, while keeping parallel connection of the electrometers, a capacitor of given capacitance C (identical for each electrometer) is added in series to the output of each electrometer. The second terminals of the various capacitors are connected to one another via a node, and a capacitor of identical capacitance is connected in parallel, one of its terminals being grounded and its other terminal being connected to the aforementioned node. Thus, if the electrometers output a potential, the capacitors thus connected form a capacitive bridge divider and there is then on the node a potential proportional to the sum of the output potentials of the electrometers.

Next, the summed voltages are amplified, for example by an LNA, then demodulated to determine the signals of the various qubits, which are excited at the same frequency, but with shifted phases.

The invention makes it possible to read more qubits while keeping an amplification block (TIA and/or voltage/voltage amplifier) of unchanged performance. The number of cables entering one of the temperature vessels, potentially the coldest temperature vessel, remains unchanged, this being noteworthy.

LIST OF CITED DOCUMENTS

Park, 2021: Park et al., A fully integrated cryo-CMOS SoC for state manipulation, readout and high-speed gate pulsing of spin qubits, IEEE Journal of Solid State Circuits, vol. 56, no. 11, 3289-3306;
Jerger, 2012: Jerger et al., Frequency division multiplexing readout and simultaneous manipulation of an array of flux qubits, arXiv:1205.6375v2;
Morel, 2022: EP4016402A1;
Abdo, 2018: WO2018/185542;
Naaman, 2021: WO2021/061776;
Bronn, 2022: US2022/0140927;

Gong, 2019: Gong et al. Design Considerations for Spin Readout Amplifiers in Monolithically Integrated Semiconductor Quantum Processors, 2019 IEEE Radio Frequency Integrated Circuits Symposium, Boston, Massachusetts, 2-4 Jun. 2019, IEEE Catalog Number: CFP19MMW-POD;
Razavi, 2000: A 622 Mb/s 4.5 pA//spI radic/Hz CMOS transimpedance amplifier, 2000 IEEE International Solid-State Circuits Conference. Digest of Technical Papers (Cat. No. 00CH37056), San Francisco, CA, USA, 2000, pp. 162-163, doi: 10.1109/ISSCC.2000.839732;
Romanova, 2019: Romanova and Barzdenas, A Review of Modern CMOS Transimpedance Amplifiers for OTDR Applications. Electronics 2019, 8, 1073. https://doi.org/10.3390/electronics8101073; Williams, 2009: EP2075745A1.

The invention claimed is:

1. A quantum device comprising a cryostat, a plurality of qubits (11, 12, . . . , 1M, 21 . . . ) in a temperature vessel of the cryostat, and for each qubit of the plurality of qubits, one electrometer (S11, S12, . . . S1M, S21 . . . ) coupled to said qubit with a view to extracting a read signal allowing a current state of the qubit to be read, the read signals of the qubits of the plurality being summed on a common read line of the quantum device, then transmitted to a demultiplexing circuit of the quantum device, the quantum device in addition being wherein, the periodic excitations transmitted to a group of a plurality of electrometers (S11, S12, . . . S1M) of the device being transmitted with an identical frequency (f1) using synchronized generating means (V1, V2 . . . ) of the quantum device outside said temperature vessel, the quantum device comprises, in said temperature vessel, phase-shifting and amplitude-attenuating means (Phi1, Phi2, . . . PhiM) that introduce distinct phase shifts into the excitations respectively applied to the electrometers (S11, S12, . . . S1M) of said group.

2. The quantum device according to claim 1, wherein the phase-shifting means (Phi1, Phi2, . . . PhiM) are also amplitude-attenuating means.

3. The quantum device according to claim 1, wherein the phase-shifting means (Phi1, Phi2, . . . PhiM) are different cable lengths, adjustable phase shifters, injection-locked oscillators or chains of CMOS inverters.

4. The quantum device according to claim 1, wherein the electrometers (S11, S12, . . . S1M, S21 . . . ) are divided into a plurality of groups, each group receiving an excitation with a frequency (f1, f2) different from those of the other groups, and the common read line is common to the electrometers of the various groups.

5. The quantum device according to claim 1, wherein each electrometer (S11, S12, . . . S1M, S21 . . . ) comprises a single-electron transistor, the read signal being a current.

6. The quantum device according to claim 1, wherein the qubits are spin qubits, and each pair consisting of a qubit and the associated electrometer is capacitively coupled via quantum dots belonging thereto.

7. The quantum device according to claim 1, wherein the phases associated with the electrometers of said group are essentially regularly distributed every $2\pi/n$ radians, n being a prime natural number greater than or equal to 3, and the distribution of the signals associated with symbols in the IQ plane is made irregular secondarily.

8. The quantum device according to claim 7, wherein the number of electrometers in the group is n−1, any one of the n values of the $2\pi/n$ radians being assigned to no electrometer of the group.

9. The quantum device according to claim 7, wherein the number of electrometers in the group is n, and the phases associated with the electrometers are distributed in the interval 0 to $2\pi$ radians in a regular first-order distribution comprising, however, in an order of lower magnitude, a phase shift suppressing the superposition between the symbol containing only 0's and the symbol containing only 1's.

10. The quantum device according to claim 7, wherein the number of electrometers in the group is n, the amplitude of at least one of the excitations being decreased or increased with respect to at least one other in order to limit the symmetries of the selected phase distribution.

11. The quantum device according to claim 1, wherein the phases associated with the electrometers of said group are essentially regularly distributed every $\pi/n$ radians, n being a natural number greater than or equal to 4, and n being the maximum number of electrometers, and their distribution is made irregular secondarily if n is greater than or equal to 5.

12. The quantum device according to claim 1, wherein the amplitudes are assigned according to the following rule: from n=1, for odd n, the same amplitude is assigned to qubit n and to qubit n+1 and amplitudes are assigned to each successive odd number by dividing the previous amplitude by 2, the phases associated with the electrometers of said group being successively incremented by $\pi/2$ radians on passing from one qubit to the following qubit, taking alternately two values shifted by $\pi/2$.

13. The quantum device according to claim 1, wherein said temperature vessel is the temperature vessel (T0) of the qubits.

14. The quantum device according to claim 1, wherein said temperature vessel is an intermediate-temperature vessel (T1), the qubits being in a temperature vessel (T0) that is at a lower temperature than said intermediate-temperature vessel (T1) and that is internal thereto, and the phase-shifting means (Phi1, Phi2, . . . PhiM) are outside the temperature vessel (T0) that is at the lower temperature but inside the intermediate-temperature vessel (T1), which also encloses an amplifier for amplifying the signal on the common read line.

* * * * *